United States Patent
Lee et al.

(10) Patent No.: US 7,307,274 B2
(45) Date of Patent: Dec. 11, 2007

(54) TRANSISTORS HAVING REINFORCEMENT LAYER PATTERNS AND METHODS OF FORMING THE SAME

(75) Inventors: Ho Lee, Gyeonggi-do (KR); Dong-Suk Shin, Yongin-si (KR); Hwa-Sung Rhee, Seongnam-si (KR); Ueno Tetsuji, Suwon-si (KR); Seung-Hwan Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/204,564

(22) Filed: Aug. 15, 2005

(65) Prior Publication Data

US 2006/0038200 A1    Feb. 23, 2006

(30) Foreign Application Priority Data

Aug. 20, 2004    (KR) ...................... 10-2004-0066077

(51) Int. Cl.
*H01L 29/06* (2006.01)
(52) U.S. Cl. ..................... 257/19; 257/24; 257/E29.193
(58) Field of Classification Search .................. 257/19, 257/20, 24, 192, 194, E29.246, E29.247, 257/E29.252, E29.193
See application file for complete search history.

(56) References Cited

U.S. PATENT DOCUMENTS

| 5,998,807 | A | 12/1999 | Lustig et al. ................. 257/66 |
| 6,429,061 | B1 | 8/2002 | Rim ............................ 438/198 |
| 6,607,948 | B1 | 8/2003 | Sugiyama et al. .......... 438/151 |
| 2005/0090066 | A1* | 4/2005 | Zhu et al. ................... 438/300 |
| 2005/0156154 | A1* | 7/2005 | Zhu et al. ...................... 257/19 |

FOREIGN PATENT DOCUMENTS

| JP | 2002-094060 | 3/2002 |
| JP | 2004-235345 | 8/2004 |
| KR | 1998-024988 | 7/1998 |
| KR | 2002-0010508 | 2/2002 |

* cited by examiner

*Primary Examiner*—Sue A. Purvis
*Assistant Examiner*—Benjamin Tzu-Hung Liu
(74) *Attorney, Agent, or Firm*—Mills & Onello LLP

(57) ABSTRACT

According to some embodiments of the invention, there is provided line photo masks that includes transistors having reinforcement layer patterns and methods of forming the same. The transistors and the methods provide a way of compensating a partially removed amount of a strained silicon layer during semiconductor fabrication processes. To the end, at least one gate pattern is disposed on an active region of a semiconductor substrate. Reinforcement layer patterns are formed to extend respectively from sidewalls of the gate pattern and disposed on a main surface of the semiconductor substrate. Each reinforcement layer pattern partially exposes each sidewall of the gate pattern. Impurity regions are disposed in the reinforcement layer patterns and the active region of the semiconductor substrate and overlap the gate pattern. Spacer patterns are disposed on the reinforcement layer patterns and partially cover the sidewalls of the gate pattern.

18 Claims, 20 Drawing Sheets

TRANSISTORS HAVING REINFORCEMENT LAYER PATTERNS AND METHODS OF FORMING THE SAME

CROSS-REFERENCE TO RELATED APPLICATION

This patent application claims priority from Korean Patent Application No. 10-2004-0066077, filed Aug. 20, 2004, the contents of which are hereby incorporated by reference in their entirety.

BACKGROUND OF INVENTION

1. Technical Field

The invention relates to transistors and methods of forming the same, more particularly, to transistors having reinforcement layer patterns and methods of forming the same.

2. Discussion of the Related Art

Transistors are formed by using many technologies with a single crystal silicon base substrate in order to realize a very high speed current driving capability. One of the technologies involves the use of a semiconductor substrate having a relaxed silicon germanium (SiGe) layer and a strained silicon layer sequentially stacked on the single crystal silicon base substrate. The semiconductor substrate is prepared using the relaxed silicon SiGe layer and changing a lattice constant of a silicon layer to form the strained silicon layer. At this time, the strained silicon layer has a higher lattice constant than that of the single crystal silicon base substrate. This means that, in the case of using the strained silicon layer as a channel of the transistor with a normal design rule, carriers in the strained silicon layer can be moved at a higher speed than in the single crystal silicon base substrate.

Further, the semiconductor substrate has source and drain regions overlapping a gate pattern of the transistor. The source and drain regions are formed by performing an ion implantation process in the semiconductor substrate. At this time, impurity ions of the source and drain regions show different diffusion velocity in the strained silicon layer and the relaxed SiGe layer. That is, the impurity ions in the strained silicon layer have a lower diffusion rate than in the relaxed SiGe layer. This the semiconductor fabrication process to effectively adjust to the gradual reduction of the design rule. Therefore, the semiconductor fabrication process produces the transistor having a very high speed current drive capability by using the semiconductor substrate.

However, the strained silicon layer may be partially removed by physical or chemical attack during the semiconductor fabrication process. Also, since the strained silicon layer becomes thin due to the physical or chemical attack, it may fail to control the diffusion velocity of the impurity ions in the source and drain regions during the semiconductor fabrication process. Thus, the impurity ions of the source and drain regions may follow to a bulk diffusion velocity of the relaxed SiGe layer instead of a surface diffusion velocity of the strained silicon layer. As such, the source and drain regions contact each other under the gate pattern, thereby causing a punchthrough phenomenon of the transistor. As a result, the strained silicon layer, which is attacked during the semiconductor fabrication process, allows the transistor not to have such a very high speed current driving capability differently from an intention of an original semiconductor circuit interconnection layout.

On the other hand, U.S. Pat. No. 6,429,061 to Kern Lim (the '061 patent) discloses method to fabricate a strained Si CMOS structure using selective epitaxial deposition of Si after device isolation formation.

According to the '061 patent, the method includes forming a relaxed SiGe layer on a surface of a substrate. Isolation regions and well implant regions are formed in the relaxed SiGe layer. A strained silicon layer is formed on the relaxed SiGe layer.

However, the method may cause a physical or chemical attack to the strained silicon layer during the semiconductor fabrication process. Thus, since the strained silicon layer becomes thin due to the physical or chemical attack, the strained silicon layer may not control the diffusion velocity of the impurity ions in the well implant regions. Thus, the attacked strained silicon layer may degrade electrical characteristics of the CMOS structure.

SUMMARY OF THE INVENTION

According to some embodiments of the invention, there are provided transistors having reinforcement layer patterns suitable for minimizing a physical or chemical attack to a strained silicon layer against a semiconductor fabrication process.

Also, according to the invention, there are provided methods of forming transistors having reinforcement layer patterns capable of minimizing a physical or chemical attack to a strained silicon layer against a semiconductor fabrication process.

According to a first aspect, the invention is directed to a transistor comprising at least one gate pattern disposed on an active region of a semiconductor substrate. Reinforcement layer patterns are disposed to extend from sidewalls of the gate pattern and disposed on a main surface of the semiconductor substrate, each reinforcement layer pattern partially exposing each sidewall of the gate pattern. Impurity regions are disposed in the reinforcement layer patterns and the active region of the semiconductor substrate and overlapping the gate pattern. Spacer patterns are disposed on the reinforcement layer patterns and partially covering the sidewalls of the gate pattern. The reinforcement layer patterns comprise an epitaxial layer, and the semiconductor substrate includes a relaxed silicon germanium ($Si_xGe_y$) layer and a strained silicon layer sequentially stacked on a single crystal silicon base substrate.

In one embodiment, the impurity regions have a conductivity type different from that of the semiconductor substrate.

In one embodiment, the impurity regions include first and second impurity ion regions, and the first and second impurity ion regions are disposed to pass the reinforcement layer pattern and the strained silicon layer and be disposed in the relaxed silicon germanium layer.

In one embodiment, the gate pattern comprises doped polysilicon.

In one embodiment, the transistor further comprises a device isolation layer disposed in the semiconductor substrate, the device isolation layer being disposed under ends of the reinforcement layer patterns and contacting the impurity regions so as to define the active region.

In one embodiment, the transistor further comprises a gate insulation layer pattern interposed between the gate pattern and the semiconductor substrate, the gate insulation layer pattern having a thickness greater than that of the reinforcement layer patterns.

In one embodiment, the transistor further comprises a gate insulation layer pattern interposed between the gate pattern and the semiconductor substrate, the gate insulation layer pattern having a thickness smaller than that of the reinforcement layer patterns.

In one embodiment, the transistor further comprises a gate insulation layer pattern interposed between the gate pattern and the semiconductor substrate, the gate insulation layer pattern having the same thickness as that of the reinforcement layer patterns.

In one embodiment, the transistor further comprises a spacer layer interposed between the gate pattern and the spacer patterns, the spacer layer covering the gate pattern and the reinforcement layer pattern.

According to another aspect, the invention is directed to a method of forming a transistor. The method comprises: forming at least one gate pattern on an active region of a semiconductor substrate, the gate pattern exposing the active region; forming reinforcement layer patterns on the active region of the semiconductor substrate, the reinforcement layer patterns contacting the gate pattern to partially expose the sidewalls thereof; forming impurity regions in the reinforcement layer patterns and the active region of the semiconductor substrate to overlap the gate pattern; and forming spacer patterns on the reinforcement layer patterns to partially cover sidewalls of the gate pattern. The reinforcement layer patterns are formed using an epitaxial layer, and the semiconductor substrate is formed using a relaxed silicon germanium ($Si_xGe_y$) layer and a strained silicon layer sequentially stacked on a single crystal silicon base substrate.

In one embodiment, the method further comprises forming a spacer layer interposed between the gate pattern and the spacer patterns, wherein the spacer layer is formed to concurrently cover the gate pattern and the reinforcement layer patterns.

In one embodiment, the method further comprises forming a gate insulation layer pattern interposed between the gate pattern and the semiconductor substrate, wherein the gate insulation layer pattern is formed to have the same thickness as that of the reinforcement layer patterns.

In one embodiment, the method further comprises forming a gate insulation layer pattern interposed between the gate pattern and the semiconductor substrate, wherein the gate insulation layer pattern is formed to have a thickness different from that of the reinforcement layer patterns.

In one embodiment, the method further comprises forming device isolation layer in the semiconductor substrate to isolate the active region, wherein the device isolation layer is formed under ends of the reinforcement layer patterns to contact the impurity regions, respectively.

In one embodiment, the impurity regions are formed to have a conductivity type different from that of the semiconductor substrate.

In one embodiment, the formation of the impurity regions comprises: performing an ion implantation process in the reinforcement layer patterns and the semiconductor substrate using the gate pattern as a mask, thereby forming first impurity ion regions; and continuously performing an ion implantation process on the reinforcement layer patterns and the semiconductor substrate using the gate pattern and the spacer patterns as a mask, thereby forming second impurity ion regions overlapping the first impurity ion regions. The first and second impurity ion regions are formed to pass the reinforcement layer patterns and the strained silicon layer and be in the relaxed silicon germanium layer.

In one embodiment, the formation of the reinforcement layer patterns comprises performing RPCVD (Reduced Pressure Chemical Vapor Deposition) on the active region of the semiconductor substrate.

In one embodiment, the gate pattern is formed using doped polysilicon.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

Figure 1:
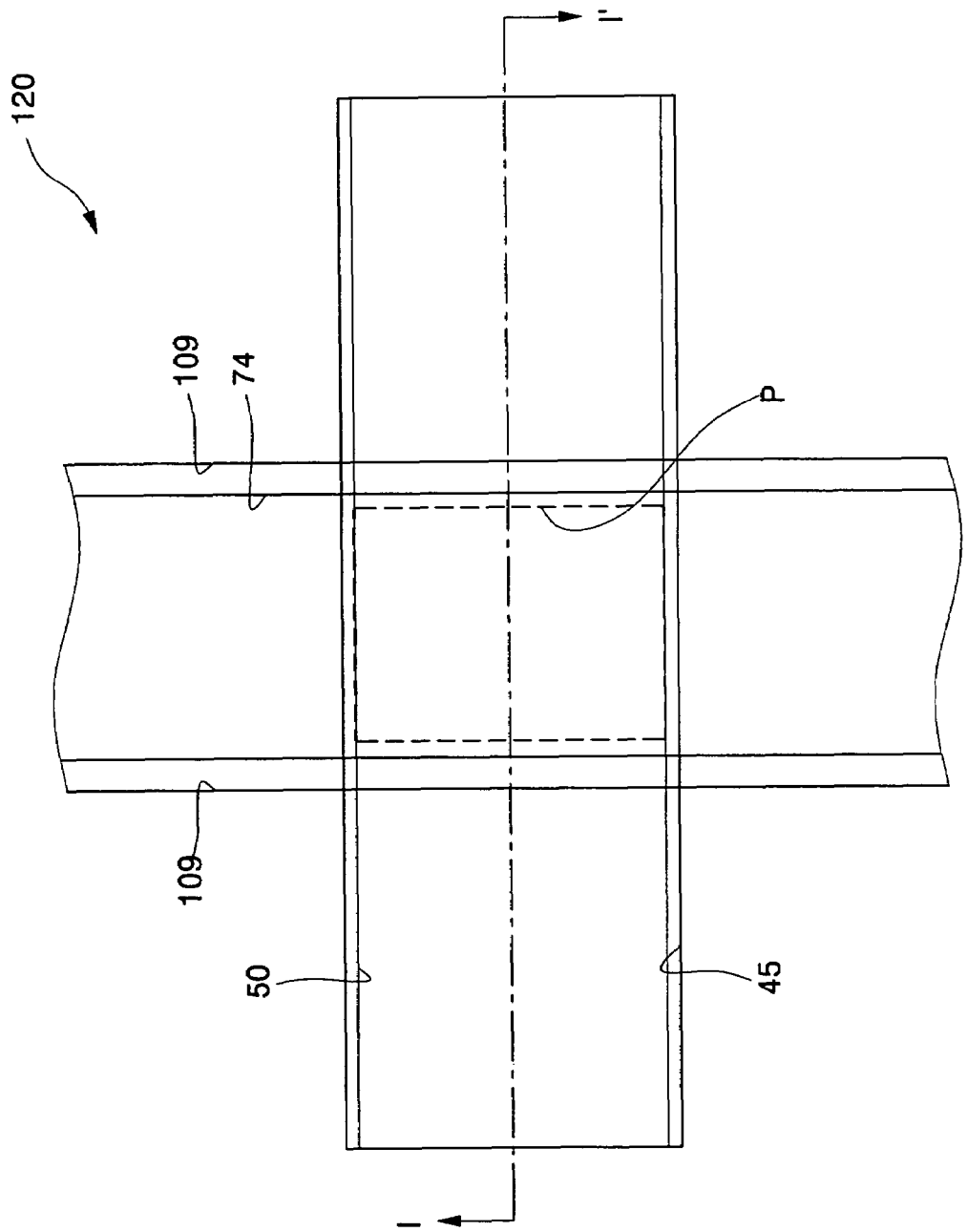
FIG. 1 is a schematic layout diagram showing a transistor according to an embodiment of the invention.
Figure 2:
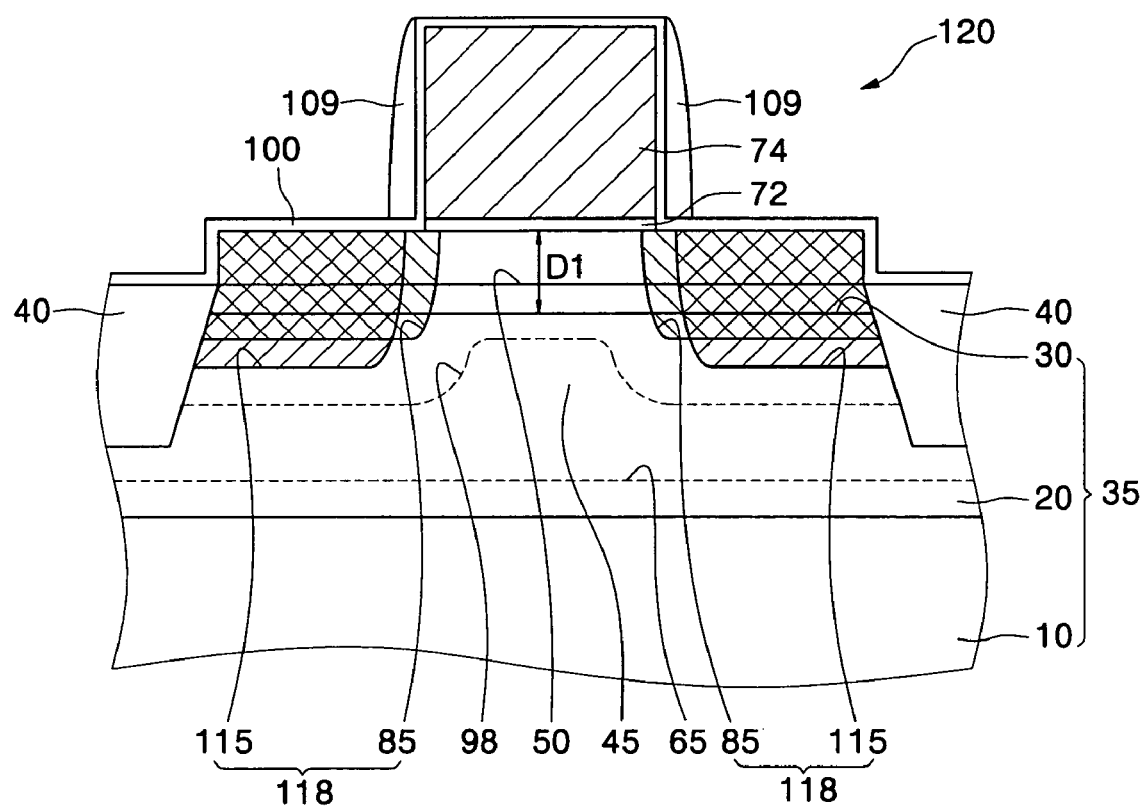
FIGS. 2 and 3 are schematic cross sectional views showing transistors taken along line I-I' of FIG. 1 according to embodiments of the invention.
Figure 3:
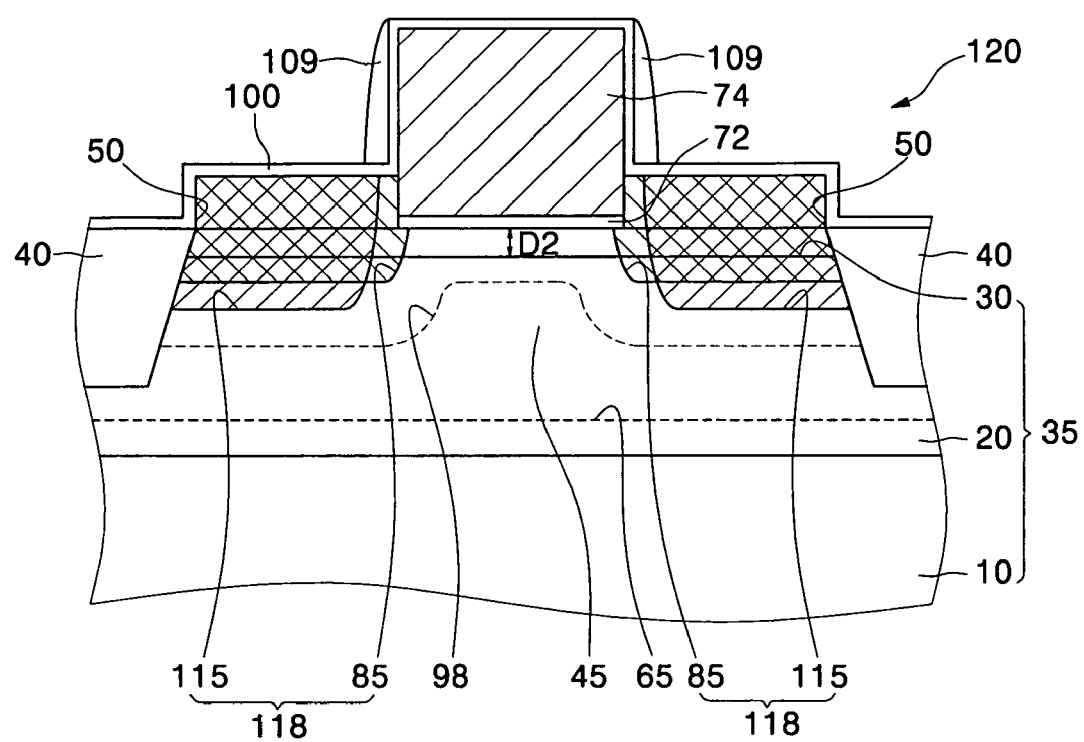

FIG. 1 is a schematic layout diagram showing a transistor according to an embodiment of the invention, and FIGS. 2 and 3 are cross sectional views showing transistors taken along line I-I' of FIG. 1 according to embodiments of the invention. Like numerals of FIGS. 1 to 3 refer to like elements. First, the two embodiments of FIGS. 2 and 3 will be described in sequence.

Referring to FIGS. 1 to 3, at least one gate pattern 74 is disposed on an active region 45 of a semiconductor substrate 35. The gate pattern 74 is preferably a doped polysilicon. The gate pattern 74 may be a doped polysilicon and a metallic silicide, which are sequentially stacked. The semiconductor substrate 35 includes a single crystal silicon base substrate 10, a relaxed silicon germanium ($Si_xGe_y$) layer 20 and a strained silicon layer 30, which are sequentially stacked. The semiconductor substrate 35 preferably has p-type impurity ions. The semiconductor substrate 35 may have n-type impurity ions. A well region 65 is disposed in the relaxed silicon germanium layer 20. The well region 65 preferably has the same conductivity type as that of the semiconductor substrate 35.

A reinforcement layer pattern 50 is disposed between the gate pattern 74 and the active region 45 of the semiconductor substrate 35. As shown in FIG. 1, the reinforcement layer pattern 50 is located on a whole surface of the active region 45 including a region P, which is indicated by a dotted line. According to another embodiment, the reinforcement layer pattern 50 may extend from sidewalls of the gate pattern 74 and be disposed on the main surface of the active region 45 of the semiconductor substrate 35. At this time, the reinforcement layer patterns 50 are not disposed in the region P. Thus, the reinforcement layer pattern 50 is disposed to contact lower portions of the sidewalls of the gate pattern 74. The reinforcement layer patterns 50 are preferably epitaxial layers.

Impurity regions 118 are disposed in the reinforcement layer pattern 50 and the active region 45 of the semiconductor substrate 35 and overlap the gate pattern 74. The impurity regions 118 preferably have a conductivity type different from that of the semiconductor substrate 35. Each of the impurity regions 118 includes first and second impurity ion regions 85, 115. The second impurity ion region 115 is self-aligned with the gate pattern 74, and disposed in the reinforcement layer pattern 50 and the semiconductor substrate 35. The first impurity ion region 85 overlaps the gate pattern 74, and is disposed in the reinforcement layer pattern 50 and the semiconductor substrate 35. According to another embodiment, impurity regions 118 may be disposed in the reinforcement layer patterns 50 and the active region 45 of the semiconductor substrate 35 and overlap the gate pattern 74. Each of the impurity regions 118 includes first and second impurity ion regions 85, 115. At this time, the second impurity ion regions 115 are disposed in the reinforcement layer patterns 50 and the semiconductor substrate 35 adjacent to the sidewalls of the gate pattern 74. The first impurity ion regions 85 are disposed in the reinforcement layer patterns 50 and the semiconductor substrate 35 and contact the sidewalls of the gate pattern 74. The first and second impurity ion regions 85, 115 preferably have different doses of impurity ions. Alternatively, the first and second impurity ion regions 85, 115 may have the same doses of impurity ions.

According to the embodiments of the invention, preferably, each of the first and second impurity ion regions 85, 115 passes the reinforcement layer pattern 50 and the strained silicon layer 30, and is disposed in the relaxed silicon germanium layer 20. Alternatively, each of the first and second impurity ion regions 85, 115 may pass the reinforcement layer pattern 50 and may be disposed in the strained silicon layer 30. A punchthrough suppression region 98 is disposed in the semiconductor substrate 35 such that the concentration peak of the impurity ions is located under the impurity regions 118. The punchthrough suppression region 98 preferably has the same conductivity type as that of the semiconductor substrate 35.

Then, a device isolation layer 40 is disposed in the semiconductor substrate 35 according to the embodiments. The device isolation layer 40 is disposed under ends of the reinforcement layer pattern 50 and contacts the impurity regions 118 so as to define the active region 45. The device isolation layer 40 is preferably an insulation layer having an etching ratio different from that of the reinforcement layer pattern 50.

A gate insulation layer pattern 72 is interposed between the gate pattern 74 and the reinforcement layer pattern 50. The gate insulation layer pattern 72 preferably has a thickness different from that of the reinforcement layer pattern 50. Alternatively, the gate insulation layer pattern 72 and the reinforcement layer pattern 50 may have a same thickness. According to another embodiment, the gate insulation layer pattern 72 may be interposed between the gate pattern 74 and the semiconductor substrate 35. At this time, the gate insulation layer pattern 72 is preferably disposed between the reinforcement layer patterns 50. The gate insulation layer pattern 72 preferably has a thickness different from that of the reinforcement layer patterns 50. The gate insulation layer pattern 72 and the reinforcement layer patterns 50 may have a same thickness. The gate insulation layer pattern 72 is preferably an insulation layer having the same etching ratio as that of the device isolation layer 40. The gate insulation layer pattern 72 may be an insulation layer having an etching ratio different from that of the device isolation layer 40.

Further, spacer patterns 109 are disposed on the reinforcement layer pattern 50 and cover the sidewalls of the gate pattern 74. The spacer patterns 109 are preferably an insulation layer having an etching ratio different from that of the gate insulation layer pattern 72. According to another embodiment, spacer patterns 109 may be disposed on the reinforcement layer patterns 50 and cover the upper portions of the sidewalls of the gate pattern 74, respectively. A spacer layer 100 is interposed between the gate pattern 74 and the spacer patterns 109. The spacer layer 100 is preferably disposed to cover the device isolation layer 40 along with the gate pattern 74 and the reinforcement layer pattern 50. The spacer layer 100 is preferably an insulation layer having an etching ratio different from that of the spacer pattern 109. The spacer layer 100 may be an insulation layer having the same etching ratio as that of the gate insulation layer pattern 72.

Describing differences in detail, one embodiment of the invention has a transistor comprising the reinforcement layer pattern 50 and the gate insulation layer pattern 72 between the gate pattern 74 and the semiconductor substrate 35. Thus, the transistor 120 according to the embodiment of FIG. 2, the invention has a channel to a predetermined thickness D1 in the strained silicon layer 30 and the reinforcement layer pattern 50. On the other hand, according to another embodiment of the invention, that is, the embodiment of FIG. 3, the reinforcement layer patterns 50 contact the lower portions of the sidewalls of the gate pattern 74 and are disposed on the main surface of the semiconductor substrate 35. At this time, the gate insulation layer pattern 72 is disposed between the reinforcement layer patterns 50 in a plane view, and interposed between the gate pattern 74 and the semiconductor substrate 35 in a vertical view. Thus, the transistor 120 according to the other embodiment of the invention, that is, the embodiment of FIG. 3, has a channel to a predetermined thickness D2 in the strained silicon layer 30.

Hereinafter, a method of forming a transistor having reinforcement layer patterns according to the invention will be described.

FIGS. 4 to 12 are cross sectional views illustrating a method of forming a transistor taken along line I-I' of FIG. 1 according to an embodiment of the invention.

Figure 4:
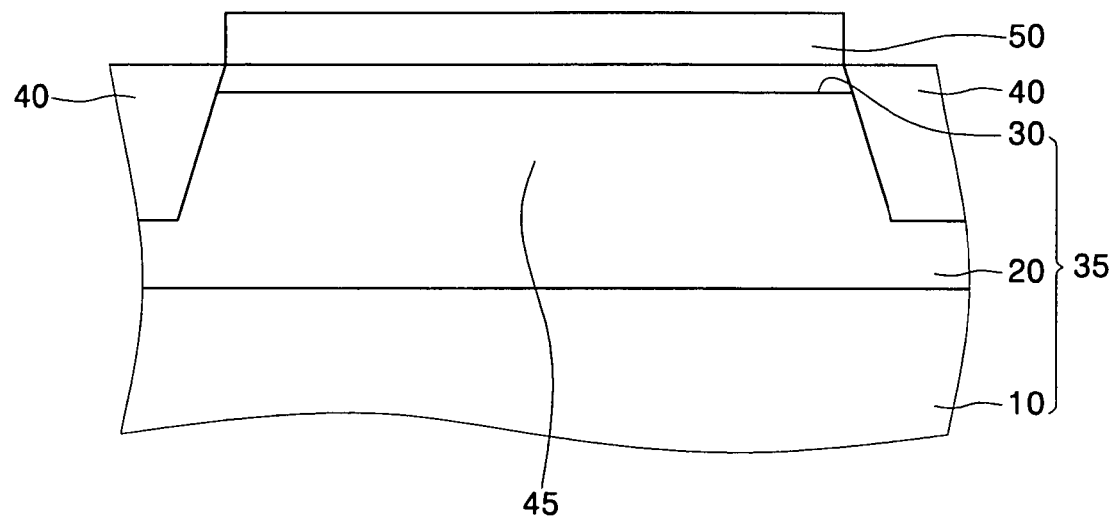
FIGS. 4 to 12 are schematic cross sectional views illustrating a method of forming a transistor taken along line I-I' of FIG. 1 according to an embodiment of the invention.
Figure 5:
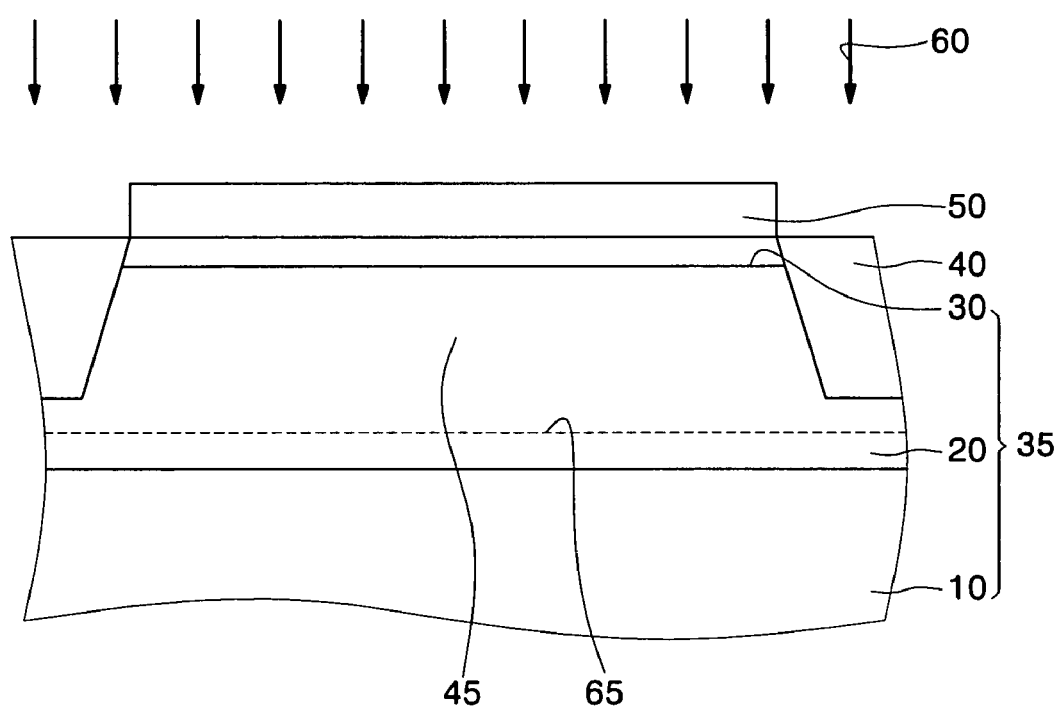

Referring to FIGS. 1, 4 and 5, a relaxed silicon germanium ($Si_xGe_y$) layer 20 and a strained silicon layer 30 are sequentially formed on a single crystal silicon base substrate 10. The single crystal silicon base substrate 10 along with a relaxed silicon germanium ($Si_xGe_y$) layer 20 and a strained silicon layer 30 forms a semiconductor substrate 35. The semiconductor substrate 35 is formed with p-type impurity ions. The semiconductor substrate 35 may be formed with n-type impurity ions.

A device isolation layer 40 is formed on the semiconductor substrate 35 so as to define an active region 45. The device isolation layer 40 is formed to pass the strained silicon layer 30 and extend into the relaxed silicon germanium layer 20. A reinforcement layer pattern 50 is formed on the active region 45 of the semiconductor substrate 35. At this time, the reinforcement layer pattern 50 is formed even in a region P of FIG. 1, which is indicated by a dotted line. The reinforcement layer pattern 50 is preferably formed of an insulation layer having an etching ratio different from that of the device isolation layer 40. The reinforcement layer patterns 50 are formed to reinforce a portion of the strained silicon layer 30 removed during the performance of a semiconductor fabrication process. The reinforcement layer pattern 50 may be formed by using an epitaxial layer. In a modification of an embodiment of the invention, the reinforcement layer pattern 50 may not be formed on the active region 45 of the semiconductor substrate 35.

The epitaxial layer is formed by using a reduced pressure chemical vapor deposition (RPCVD). At this time, the RPCVD comprises cleaning the surface of the relaxed silicon germanium layer 20 with hydrogen at a temperature lower than 850° C., and forming an epitaxial layer with mixed process gases including $SiH_2Cl_2$ and HCl at a temperature lower than 750° C. The epitaxial layer is a silicon layer, which is formed by using the strained silicon layer 20 as a seed.

An ion implantation process 60 is performed in the semiconductor substrate 35 to form a well region 65 in the relaxed silicon germanium layer 20. The ion implantation process 60 may be performed by implanting the impurity ions having the same conductivity type as that of the semiconductor substrate 35. Thus, the well region 65 is preferably formed to have the same conductivity type as that of the semiconductor substrate 35. In a modification of an embodiment of the invention, the reinforcement layer pattern 50 may be formed on the active region 45 of the semiconductor substrate 35 after the formation of the well region 65.

Figure 6:
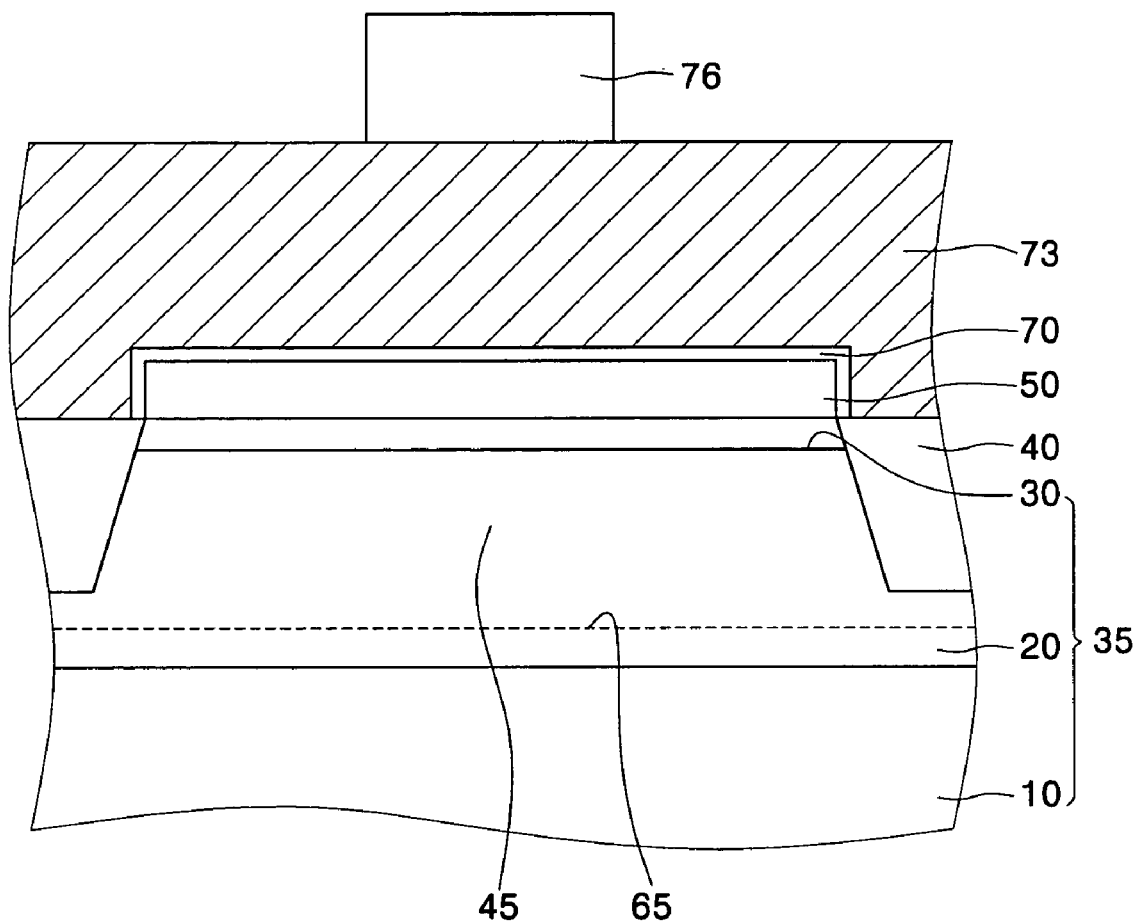
Figure 7:
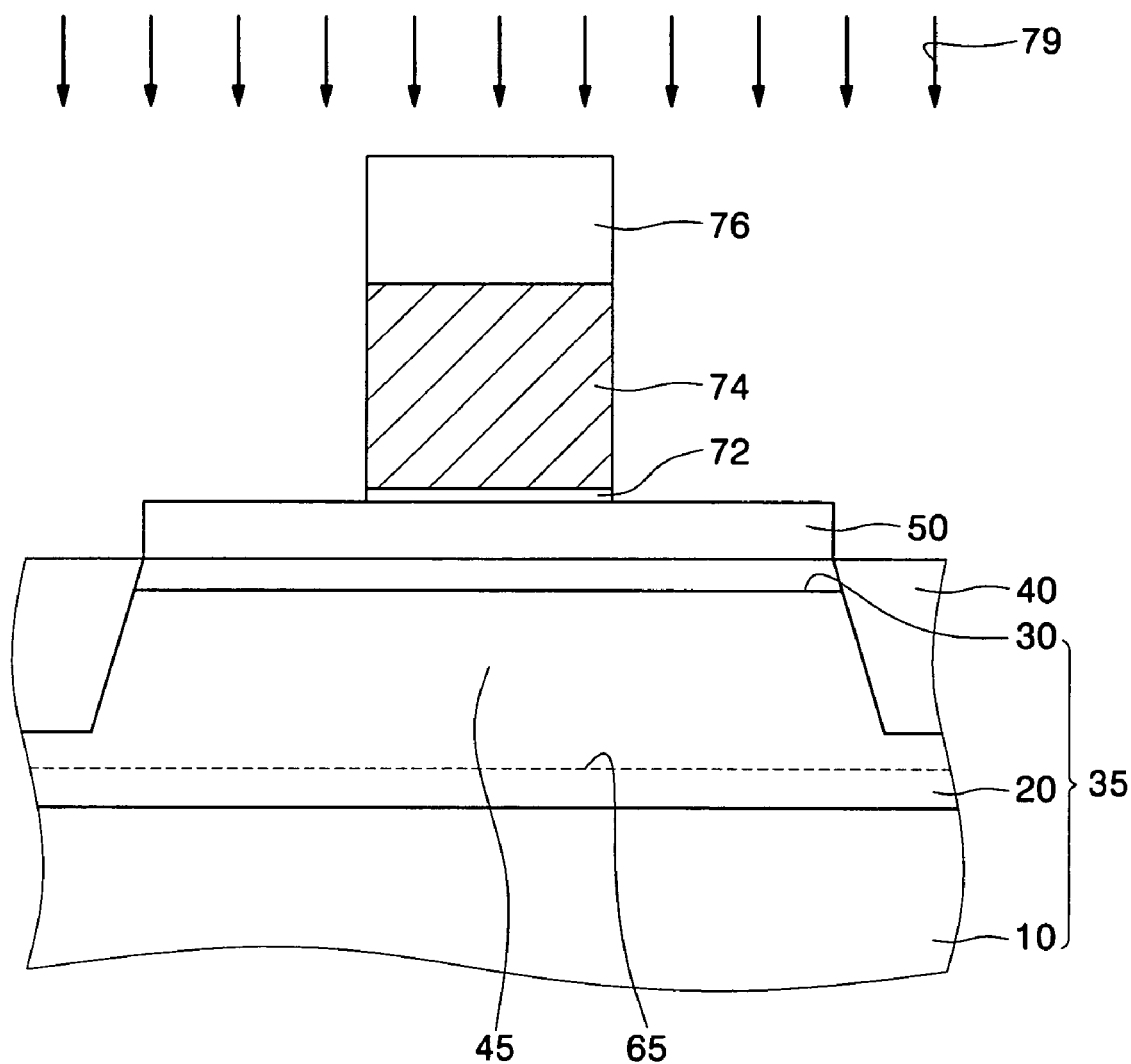

Referring to FIGS. 1, 6 and 7, a gate insulation layer 70 and a gate layer 73 are sequentially formed to cover the reinforcement layer pattern 50. Then, at least one photoresist pattern 76 is formed on the gate layer 73, and the photoresist pattern 76 is preferably formed over the middle portion of the active region 45. The gate layer 73 is preferably formed of a doped polysilicon. The gate layer 73 may be formed by using a doped polysilicon and a metallic silicide, which are sequentially stacked. The gate insulation layer 70 is preferably formed of an insulation layer having the same etching ratio as that of the device isolation layer 40. The gate insulation layer 70 may be formed of an insulation layer having an etching ratio different from that of the device isolation layer 40.

By using the photoresist pattern 76 as an etching mask, an etching process 79 is sequentially performed on the gate layer 73 and the gate insulation layer 70. The etching process 79 may be performed to expose the reinforcement layer pattern 50 and the device isolation layer 40. Thus, the etching process 79 forms a gate insulation layer pattern 72 and a gate pattern 74 between the photoresist pattern 76 and the reinforcement layer pattern 50. The reinforcement layer pattern 50 and the strained silicon layer 30 under the gate pattern 74 may be formed as a channel of a transistor. The reinforcement layer pattern 50 functions to protect the strained silicon layer 30 during the performance of the etching process. The gate insulation layer pattern 72 preferably has a thickness different from that of the reinforcement layer pattern 50. The reinforcement layer patterns 50 may be formed to have the same thickness as that of the gate insulation layer pattern 72. After the formation of the gate insulation layer pattern 72 and the gate pattern 74, the photoresist pattern 76 is removed from the semiconductor substrate 35.

Figure 8:
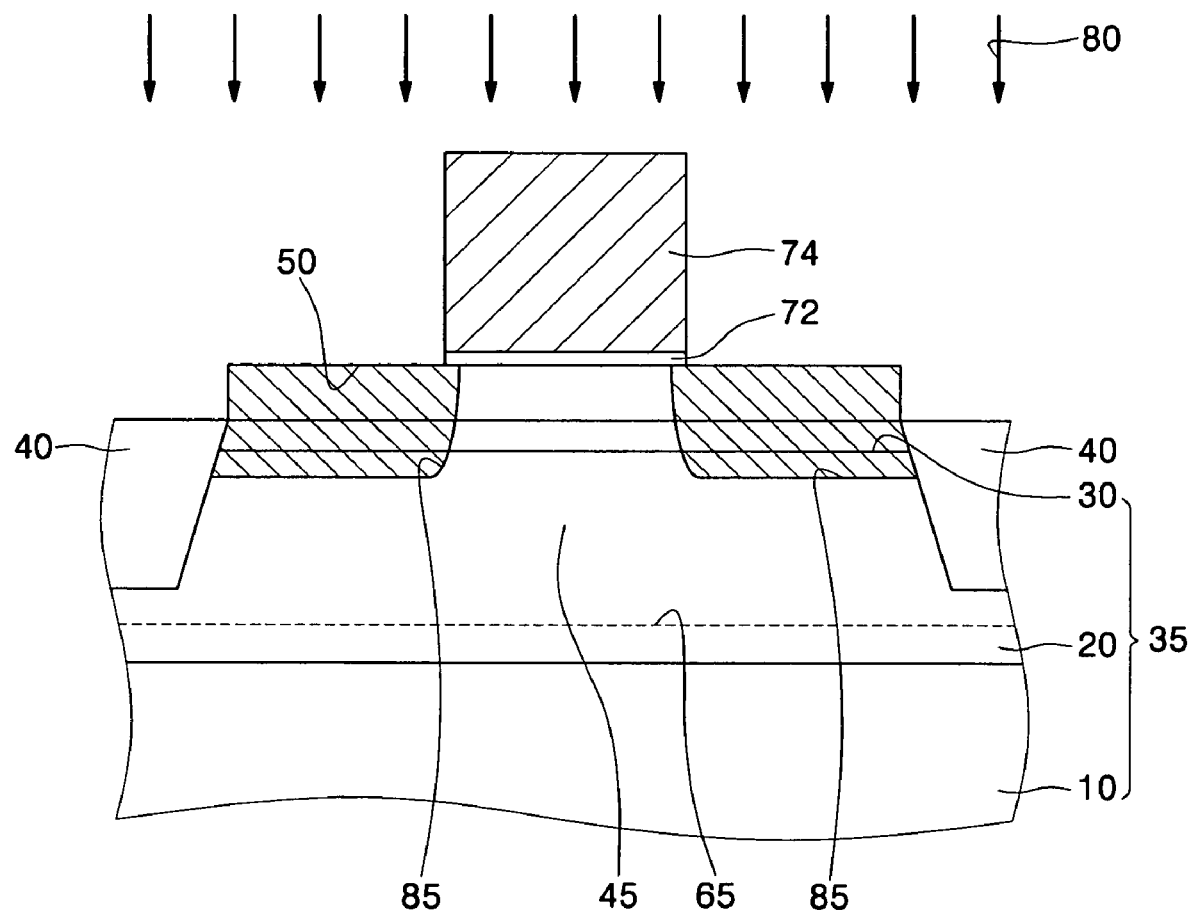
Figure 9:
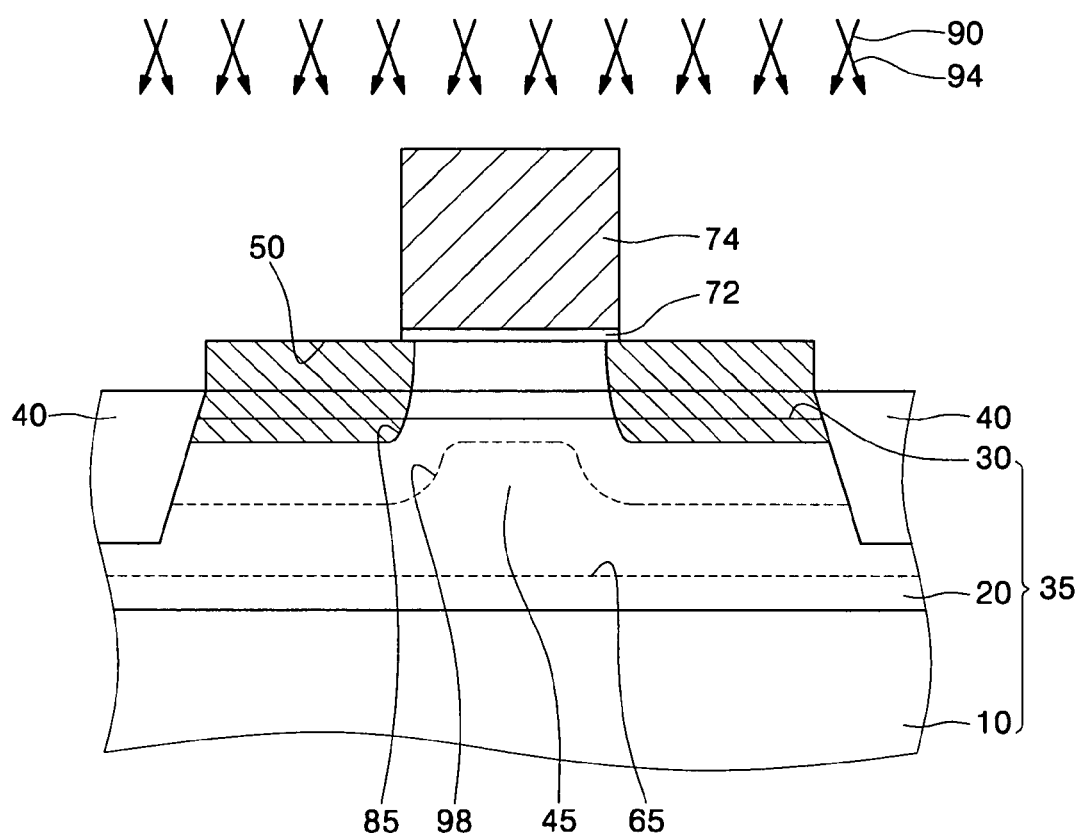

Referring to FIGS. 1, 8 and 9, by using the gate pattern 74 and the device isolation layer 40 as a mask, an ion implantation process 80 is performed in the reinforcement layer pattern 50 and the semiconductor substrate 35. The ion implantation process 80 forms first impurity ion regions 85 in the reinforcement layer pattern 50 and the semiconductor substrate 35 to overlap the gate pattern 74. The first impurity ion regions 85 are preferably formed to pass the reinforcement layer pattern 50 and the strained silicon layer 30 and be in the relaxed silicon germanium layer 20. The first impurity ion regions 85 may be formed to pass the reinforcement layer pattern 50 and be in the strained silicon layer 30. The first impurity ion regions 85 are preferably formed to have impurity ions having a conductivity type different from that of the semiconductor substrate 35.

By using the gate pattern 74 as a mask, ion implantation processes 90, 94 are sequentially performed in the reinforcement layer pattern 50 and the semiconductor substrate 35 by using impurity ions. The ion implantation processes 90, 94 may be performed by using ion implantation equipment with an ion gun tilted with respect to the main surface of the semiconductor substrate 35. The ion implantation processes 90, 94 form a punchthrough suppression region 98 in the relaxed silicon germanium layer 20. The punchthrough suppression region 98 is preferably formed to have the same conductivity type as that of the semiconductor substrate 35. A concentration peak of the impurity ions of the punchthrough suppression region 98 is formed under the first impurity ion regions 85. At this time, the punchthrough suppression region 98 functions to prevent the first impurity ion regions 85 from contacting each other.

Figure 10:
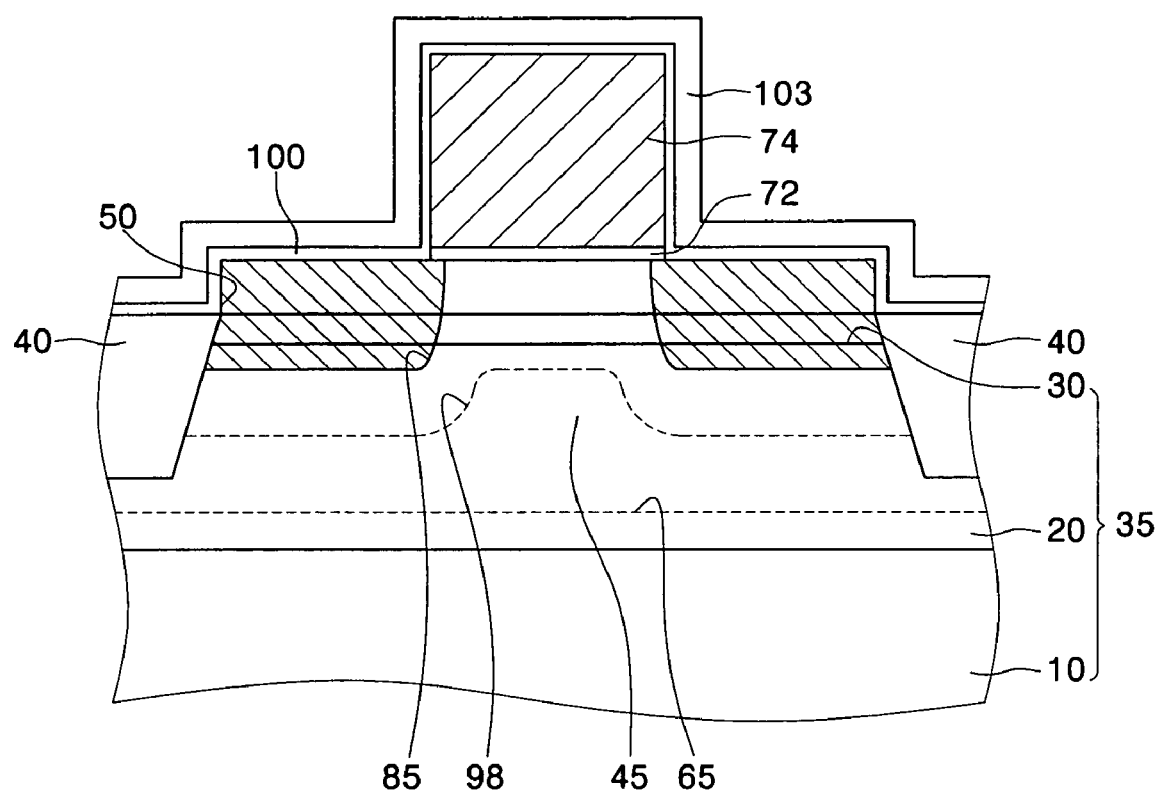
Figure 11:
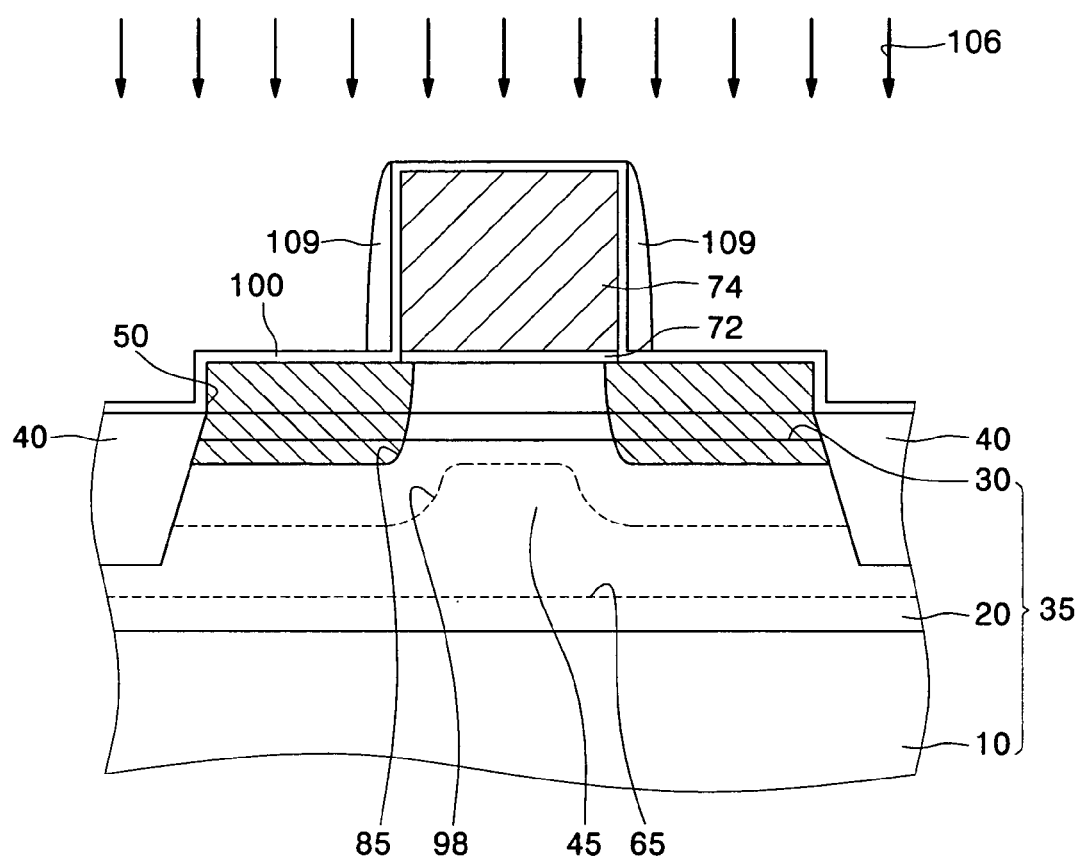
Figure 12:
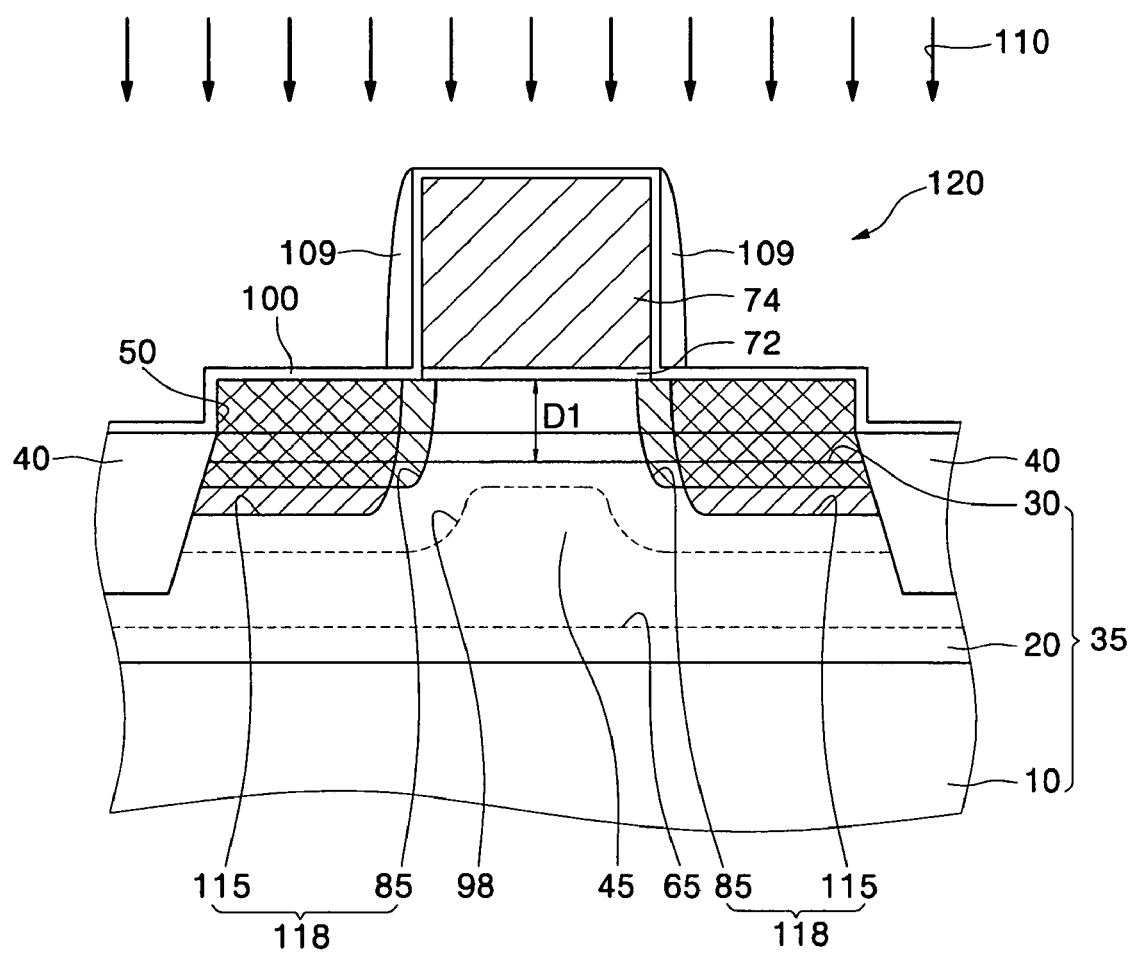

Referring to FIGS. 1, 10, and 12, a spacer layer 100 and a spacer pattern layer 103 are sequentially formed to cover the device isolation layer 40 along with the gate pattern 74 and the reinforcement layer pattern 50. The spacer pattern layer 103 is preferably formed by using an insulation layer having an etching ratio different from that of the spacer layer 100. The spacer layer 100 may be formed by using an insulation layer having the same etching ratio as that of the gate insulation layer pattern 72.

By using the spacer layer 100 as an etching buffer layer, an etching process 106 is performed on the spacer pattern layer 103. The etching process 106 forms spacer patterns 109 on the spacer layer 100 to cover sidewalls of the gate pattern 74. At this time, the spacer layer 100 exists between the spacer patterns 109 and the gate pattern 74.

Then, by using the spacer patterns 109 and the gate pattern 74 as a mask, an ion implantation process 110 is performed in the reinforcement layer pattern 50 and the semiconductor substrate 35. The ion implantation process 110 forms second impurity ion regions 115 in the reinforcement layer pattern 50 and the semiconductor substrate 35. The second impurity ion regions 115 are formed to be self-aligned to the gate pattern 74. The second impurity ion regions 115 overlap the first impurity ion regions 85. The second impurity ion regions 115 are preferably formed to pass the reinforcement layer pattern 50 and the strained silicon layer 30 and be in the relaxed silicon germanium layer 20. The second impurity ion regions 115 may be formed to pass the reinforcement layer pattern 50 and be in the strained silicon layer 30. The second impurity ion regions 115 may be formed by using impurity ions having a conductivity type different from that of the semiconductor substrate 35. The first and second impurity ion regions 85, 115 are preferably formed with different doses of impurity ions. Alternatively, the first and second impurity ion regions 85, 115 may be formed with a same dose of impurity ions. The first and second impurity ion regions 85, 115, which are self-aligned with both sides of the gate pattern 74, form impurity regions 118. The impurity regions 118 form source and drain regions. As such, a transistor 120 according to an embodiment of the invention is formed.

As a result, the transistor 120 is formed to have the gate pattern 74 on the reinforcement layer pattern 50, and impurity regions 118 over a main surface of the single crystal silicon base substrate 10. Further, the transistor 120 has a channel to a predetermined thickness D1 in a reinforcement layer pattern 50 and the strained silicon layer 30. Also, since the reinforcement layer pattern 50 is formed after the formation of the device isolation layer 40 or the well region 65, the transistor 120 can have the channel along with the impurity regions 118, which are not vulnerable to reduction of resistance as the semiconductor fabrication process goes on.

Figure 13:
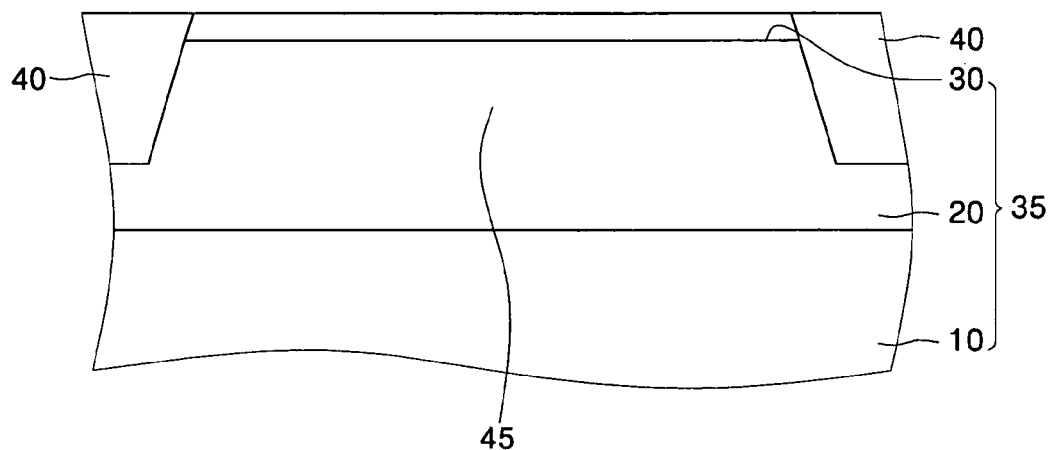
FIGS. 13 to 21 are schematic cross sectional views illustrating a method of forming a transistor taken along line I-I' of FIG. 1 according to another embodiment of the invention.
Figure 14:
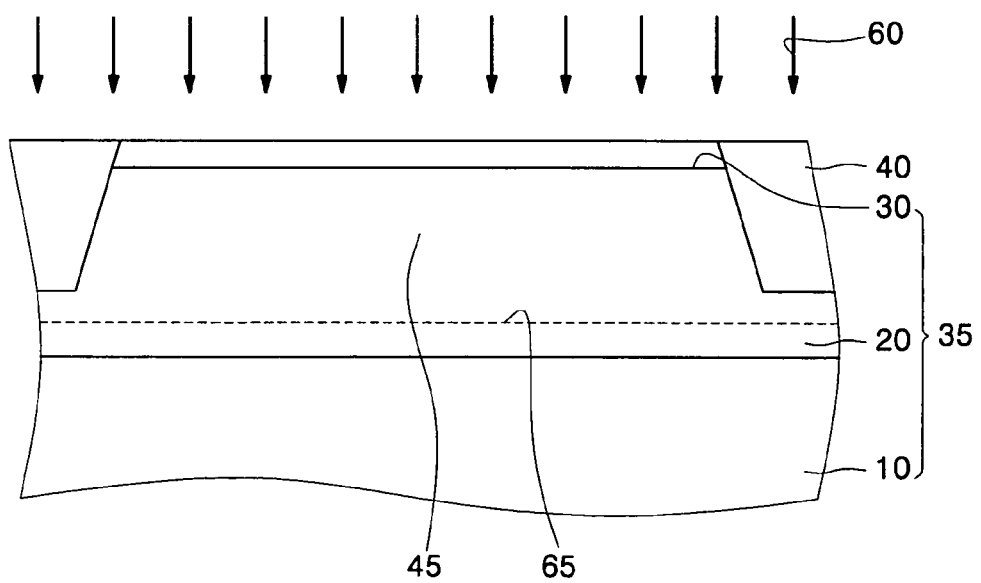

FIGS. 13 to 21 are cross sectional views illustrating a method of forming a transistor taken along line I-I' of FIG. 1 according to another embodiment of the invention. Referring to FIGS. 1, 13, and 14, a relaxed silicon germanium ($Si_xGe_y$) layer 20 and a strained silicon layer 30 are sequentially formed on a single crystal silicon base substrate 10. The single crystal silicon base substrate 10 along with a relaxed silicon germanium ($Si_xGe_y$) layer 20 and a strained silicon layer 30 forms a semiconductor substrate 35. The semiconductor substrate 35 is formed with p-type impurity ions. The semiconductor substrate 35 may be formed with n-type impurity ions. A device isolation layer 40 is formed in the semiconductor substrate 35 to define an active region 45. The device isolation layer 40 is formed to pass the strained silicon layer 30 and to extend into the relaxed silicon germanium layer 20.

Then, an ion implantation process 60 is performed in the semiconductor substrate 35 to form a well region 65 in the relaxed silicon germanium layer 20. The ion implantation process 60 may be performed by using impurity ions having the same conductivity type as that of the semiconductor substrate 35. Thus, the well region 65 is preferably formed to have the same conductivity type as that of the semiconductor substrate 35.

Figure 15:
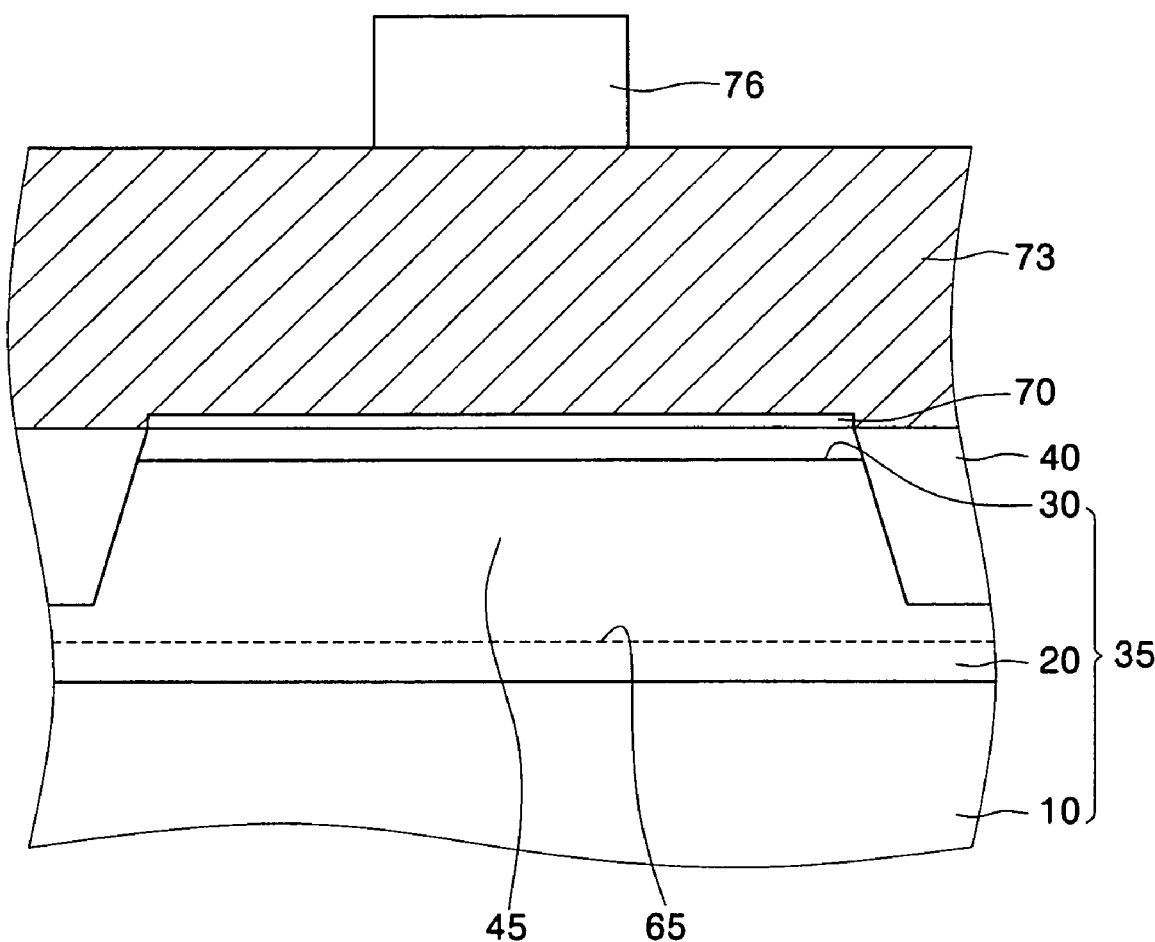
Figure 16:
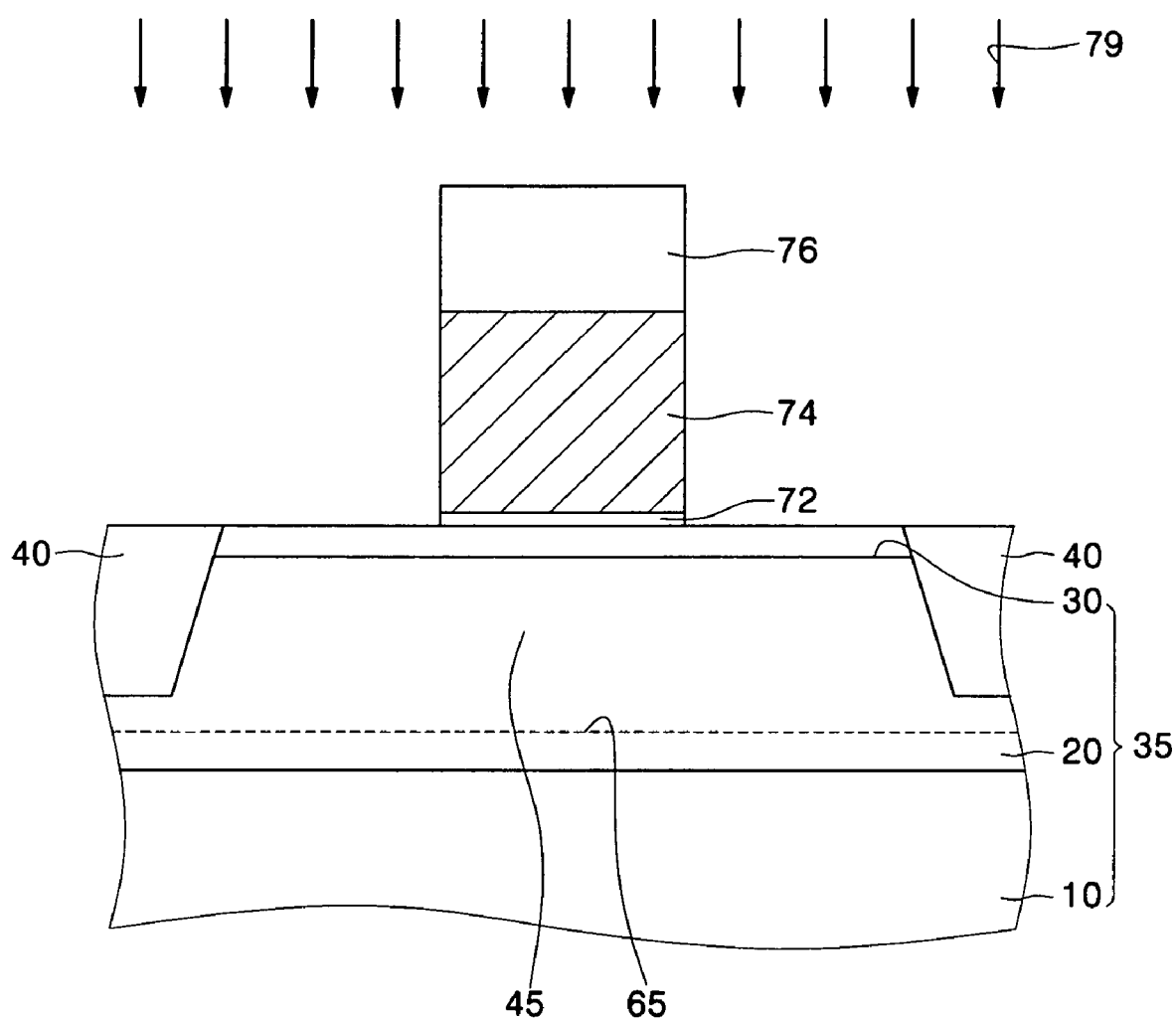

Referring to FIGS. 1, 15 and 16, a gate insulation layer 70 and a gate layer 73 are sequentially formed to cover the active region 45 and the device isolation layer 40. At least one photoresist pattern 76 is formed on the gate layer 73 to be over the middle portion of the active region 45. The gate layer 73 is preferably formed by using a doped polysilicon. The gate layer 73 may be formed by using a doped polysilicon and a metallic silicide, which are sequentially stacked. The gate insulation layer 70 is preferably formed by using an insulation layer having the same etching ratio as that of the device isolation layer 40. The gate insulation layer 70 may be formed by using an insulation layer having an etching ratio different from that of the device isolation layer 40.

By using the photoresist pattern 76 as an etching mask, an etching process 79 is sequentially performed in the gate layer 73 and the gate insulation layer 70. The etching process 79 may be performed to expose the active region 45 of the semiconductor substrate 35 and the device isolation layer 40. The etching process 79 forms a gate insulation layer pattern 72 and a gate pattern 74, which are sequentially formed between the photoresist pattern 76 and the active region 45 of the semiconductor substrate 35. At this time, the strained silicon layer 30 below the gate pattern 74 may be used as a channel of a transistor. After the formation of the gate insulation layer pattern 72 and the gate pattern 74, the photoresist pattern 76 is removed from the semiconductor substrate 35.

Figure 17:
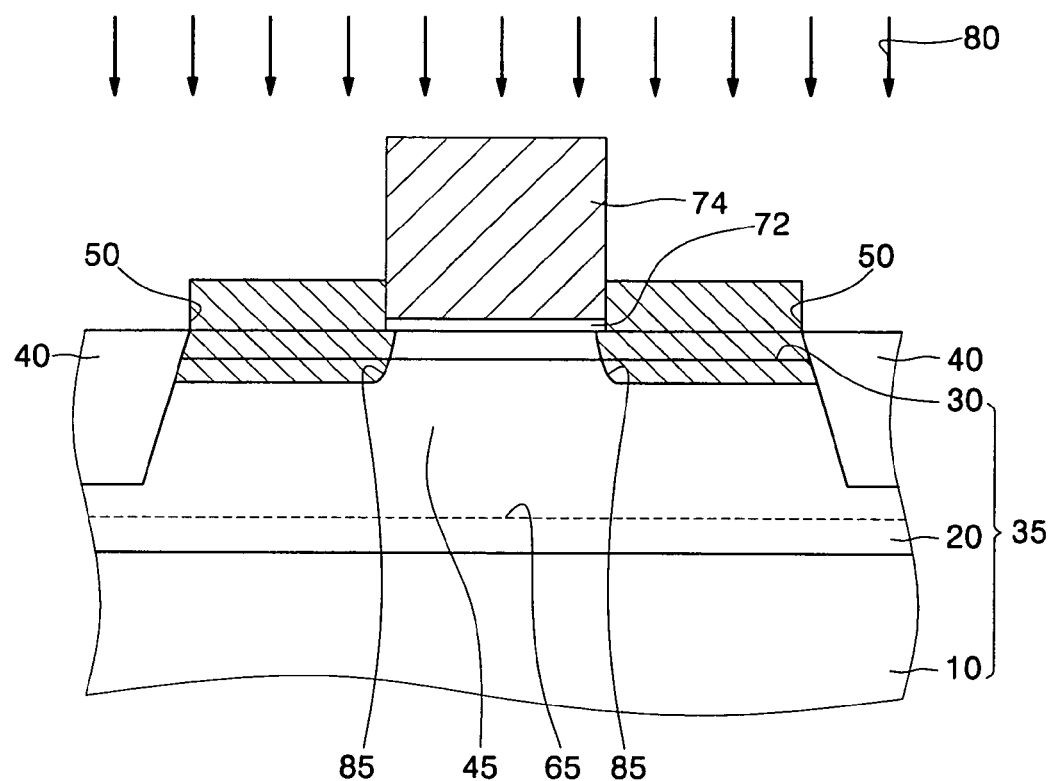
Figure 18:
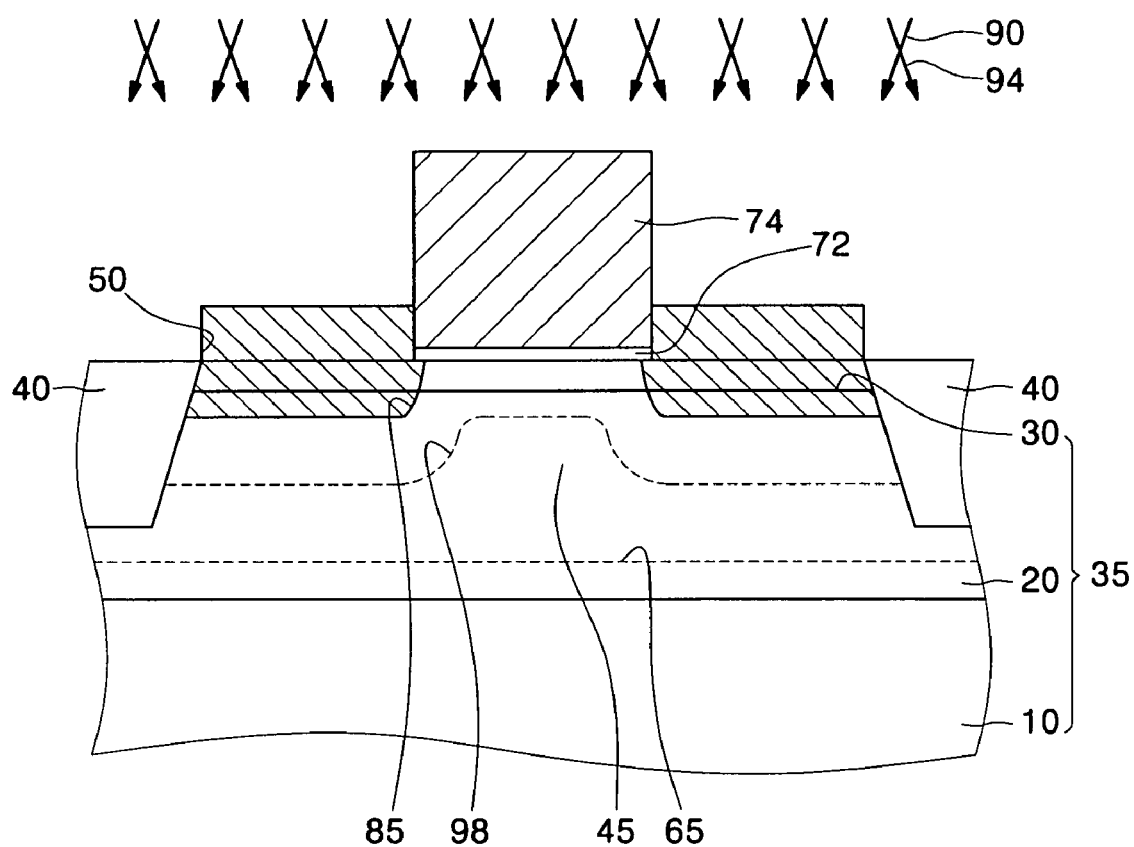
Figure 19:
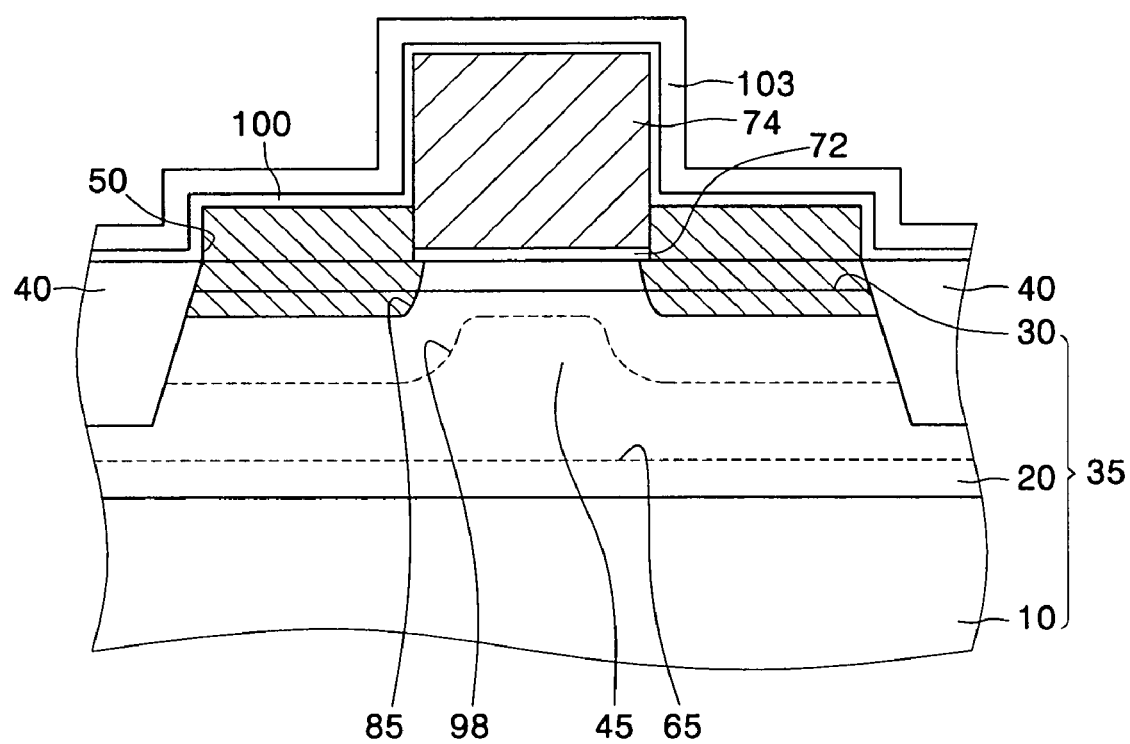
Figure 20:
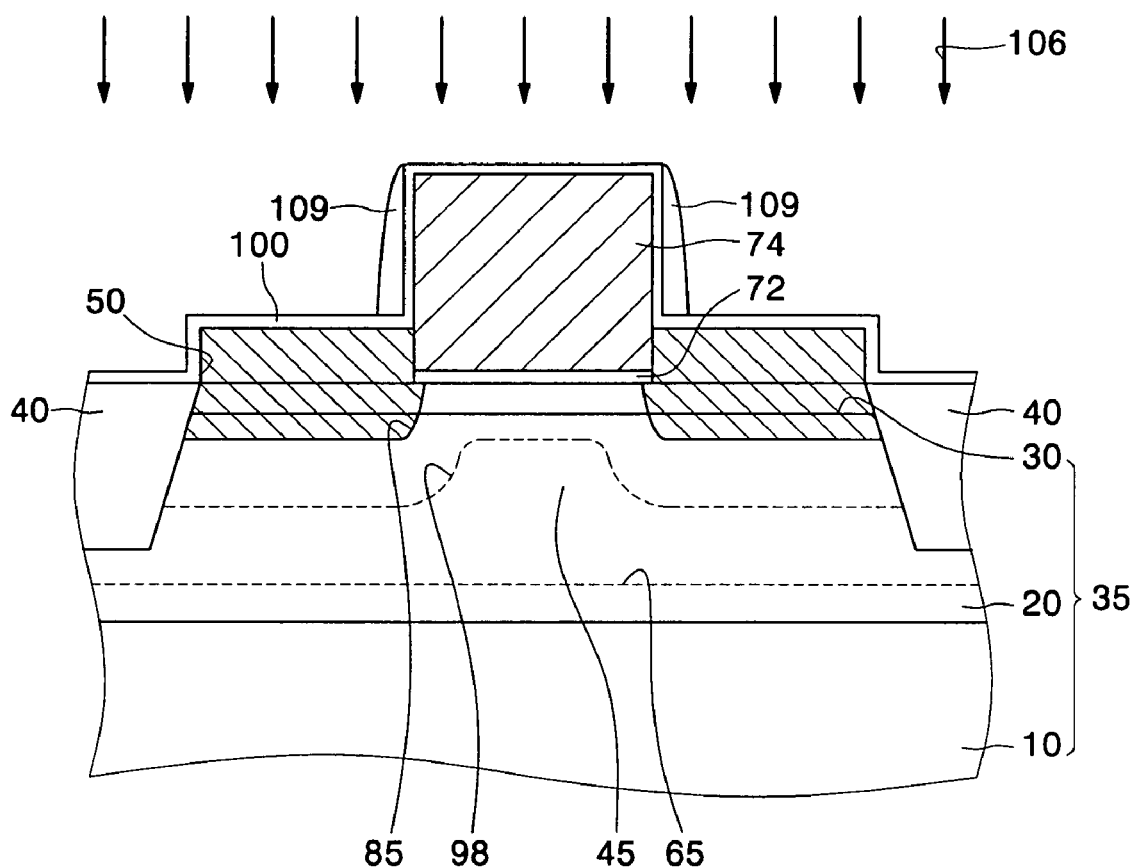
Figure 21:
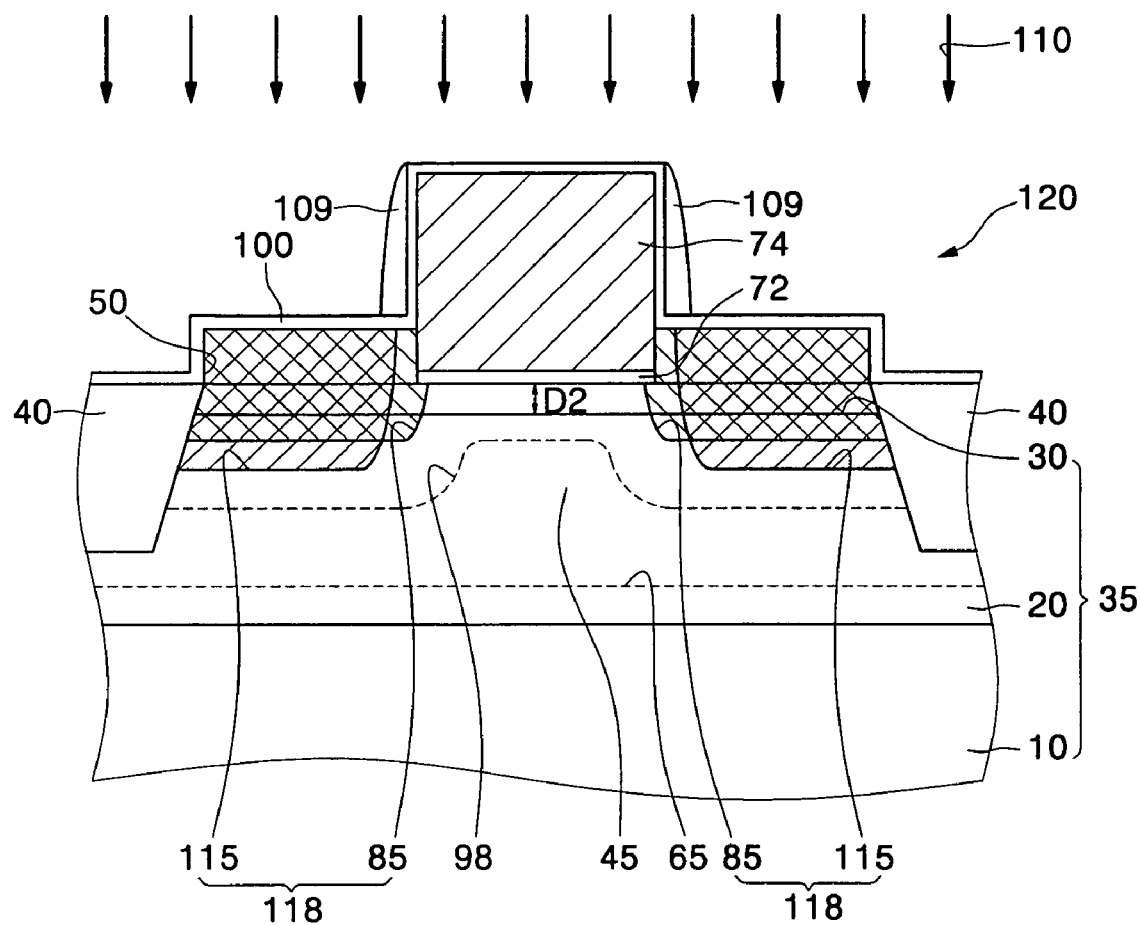

Referring to FIGS. 1, 17, and 18, reinforcement layer patterns 50 are formed on the active region 45 of the semiconductor substrate 35 to contact sidewalls of the gate pattern 74. The reinforcement layer patterns 50 are not formed in a region P of FIG. 1, which is indicated by a dotted line. The reinforcement layer patterns 50 partially expose the sidewalls of the gate pattern 74. At this time, the reinforcement layer patterns 50 are preferably formed to extend toward an opposite directions from the gate pattern 74. The reinforcement layer patterns 50 are preferably formed by using an epitaxial layer. The reinforcement layer patterns 50 function to protect the strained silicon layer 30 exposed to the gate pattern 74 from the semiconductor fabrication process. Further, the reinforcement layer patterns 50 is preferably formed to have a thickness different from that of the gate insulation layer pattern 72. The reinforcement layer patterns 50 may be formed to have the same thickness as that of the gate insulation layer pattern 72.

In one embodiment, the epitaxial layer is formed by using a reduced pressure chemical vapor deposition (RPCVD). The RPCVD comprises cleaning the surface of the relaxed silicon germanium layer 20 with hydrogen at a temperature lower than 850° C., and forming an epitaxial layer with process gases made by mixing $SiH_2Cl_2$ and HCl at a temperature lower than 750° C. The epitaxial layer is a silicon layer, which is formed by using the strained silicon layer 20 as a seed.

By using the gate pattern 74 as a mask, an ion implantation process 80 is performed in the reinforcement layer patterns 50 and the semiconductor substrate 35. The ion implantation process 80 forms first impurity ion regions 85 in the reinforcement layer patterns 50 and the semiconductor substrate 35 to overlap the gate pattern 74. At this time, the first impurity ion regions 85 are preferably formed to pass the reinforcement layer patterns 50 and the strained silicon layer 30 and be in the relaxed silicon layer 20. The first impurity ion regions 85 may be formed to pass the reinforcement layer patterns 50 and to be in the strained silicon layer 30. The first impurity ion regions 85 are preferably formed to have impurity ions having a conductivity type different from that of the semiconductor substrate 35.

By using the gate pattern 74 as a mask, ion implantation processes 90, 94 are continuously performed in the reinforcement layer patterns 50 and the semiconductor substrate 35 by using impurity ions. The ion implantation processes 90, 94 may be performed by using ion implantation equipment with the ion gun tilted with respect to the main surface of the semiconductor substrate 35. The ion implantation processes 90, 94 form a punchthrough suppression region 98 in the relaxed silicon germanium layer 20. The punchthrough suppression region 98 preferably has the same conductivity type as that of the semiconductor substrate 35. The concentration peak of the impurity ions of the punchthrough suppression region 98 is formed under the first impurity ion regions 85. At this time, the punchthrough suppression region 98 prevents the first impurity ion regions 85 form contacting each other.

Referring to FIGS. 1, and 19 to 21, a spacer layer 100 and a spacer pattern layer 103 are sequentially formed to cover the device isolation layer 40 along with the gate pattern 74 and the reinforcement layer pattern 50. The spacer pattern layer 103 is preferably formed by using an insulation layer having an etching ratio different from that of the spacer layer 100. The spacer layer 100 may be formed by using an insulation layer having the same etching ratio as that of the gate insulation layer pattern 72.

By using the spacer layer 100 as an etching buffer layer, an etching process 106 is performed on the spacer pattern layer 103. The etching process 106 forms spacer patterns 109 on the spacer layer 100 to partially cover the sidewalls of the gate pattern 74. At this time, the spacer layer 100 is formed between the spacer patterns 109 and the gate pattern 74.

Then, by using the spacer patterns 109 and the gate pattern 74 as a mask, an ion implantation process 110 is performed in the reinforcement layer patterns 50 and the semiconductor substrate 35. The ion implantation process 110 forms second impurity ion regions 115 in the reinforcement layer patterns 50 and the semiconductor substrate 35. At this time, the second impurity ion regions 115 are formed to be self-aligned with the gate pattern 74. The second impurity ion regions 115 overlap the first impurity ion regions 85. The second impurity ion regions 115 are preferably formed to pass the reinforcement layer patterns 50 and the strained silicon layer 30 and be in the relaxed silicon germanium layer 20. The second impurity ion regions 115 may be formed to pass the reinforcement layer patterns 50 and be in the strained silicon layer 30. The second impurity ion regions 115 are preferably formed by using impurity ions having a conductivity type different from that of the semiconductor substrate 35. The first and second impurity ion regions 85, 115 are preferably formed to have different doses of impurity ions. The first and second impurity ion regions 85, 115 may have a same dose of impurity ions. The first and second impurity ion regions 85, 115, which are self-aligned with the sidewalls of the gate pattern 74, form impurity regions 118. The impurity regions 118 form source and drain regions. Thus, a transistor 120 is formed according to another embodiment of the invention.

As a result, the transistor 120 is formed to have the gate pattern 74 between the reinforcement layer patterns 50, and impurity regions 118 over a main surface of the single crystal silicon base substrate 10. Further, the transistor 120 has a channel to a predetermined thickness D2 in the strained silicon layer 30. Also, since the reinforcement layer patterns 50 are formed after the formation of the gate pattern 74, the transistor 120 can have the source and drain regions, which are not vulnerable to reduction of resistance as the semiconductor fabrication process goes on.

As described above, the invention provides at least one reinforcement layer pattern on the semiconductor substrate to minimize a removed amount of a strained silicon layer during the performance of the semiconductor fabrication process. As such, the invention provides a way of reducing a resistance of a channel along with source and drain regions of the transistor by using the reinforcement layer pattern, thereby improving a current driving capability of the transistor.

Embodiments of the invention provide transistors having reinforcement layer patterns and methods of forming the same.

According to some embodiment of the invention, there are provided transistors having reinforcement layer patterns that include at least one gate pattern disposed on an active region of a semiconductor substrate. Reinforcement layer patterns are disposed to extend respectively from sidewalls of the gate pattern and disposed on a main surface of the semiconductor substrate. Each reinforcement layer pattern partially exposes each sidewall of the gate pattern. Impurity regions are disposed in the reinforcement layer patterns and the active region of the semiconductor substrate and overlap the gate pattern. Spacer patterns are disposed on the reinforcement layer patterns and partially cover the sidewalls of the gate pattern. At this time, the reinforcement layer patterns are an epitaxial layer. The semiconductor substrate includes a relaxed silicon germanium ($Si_xGe_y$) layer and a strained silicon layer sequentially stacked on a single crystal silicon base substrate.

According to the other embodiment of the invention, there are provided methods of forming transistors having reinforcement layer patterns that include forming at least one gate pattern on an active region of a semiconductor substrate, the gate pattern exposing the active region. Reinforcement layer patterns are formed on the active region of the semiconductor substrate and contact the gate pattern to partially expose the sidewalls thereof, respectively. Impurity regions are formed in the reinforcement layer patterns and the active region of the semiconductor substrate to overlap the gate pattern. Spacer patterns are formed on the reinforcement layer patterns to partially cover sidewalls of the gate pattern, respectively. At this time, the reinforcement layer patterns are formed by using epitaxial layer. The semiconductor substrate is formed by using a relaxed silicon germanium ($Si_xGe_y$) layer and a strained silicon layer sequentially stacked on a single crystal silicon base substrate.

What is claimed is:

1. A transistor comprising:
   at least one gate pattern disposed on an active region of a semiconductor substrate;
   reinforcement layer patterns disposed to extend from sidewalls of the gate pattern and disposed on a main surface of the semiconductor substrate;
   impurity regions disposed in the reinforcement layer patterns and the active region of the semiconductor substrate and overlapping the gate pattern, the impurity regions including first and second impurity regions; and
   spacer patterns disposed on the reinforcement layer patterns and partially covering the sidewalls of the gate pattern, wherein
   the reinforcement layer patterns comprise an epitaxial layer, and the semiconductor substrate includes a relaxed silicon germanium ($Si_xGe_y$) layer and a strained silicon layer sequentially stacked on a single crystal silicon base substrate.

2. The transistor according to claim 1, wherein the impurity regions have a conductivity type different from that of the semiconductor substrate.

3. The transistor according to claim 1, wherein the first and second impurity ion regions are disposed to pass the reinforcement layer pattern and the strained silicon layer and be disposed in the relaxed silicon germanium layer.

4. The transistor according to claim 1, wherein the gate pattern comprises doped polysilicon.

5. The transistor according to claim 1, further comprising a device isolation layer disposed in the semiconductor substrate, the device isolation layer being disposed under ends of the reinforcement layer patterns and contacting the impurity regions so as to define the active region.

6. The transistor according to claim 1, further comprising a gate insulation layer pattern interposed between the gate pattern and the semiconductor substrate, the gate insulation layer pattern having a thickness greater than that of the reinforcement layer patterns.

7. The transistor according to claim 1, further comprising a gate insulation layer pattern interposed between the gate pattern and the semiconductor substrate, the gate insulation layer pattern having a thickness smaller than that of the reinforcement layer patterns.

8. The transistor according to claim 1, further comprising a gate insulation layer pattern interposed between the gate pattern and the semiconductor substrate, the gate insulation layer pattern having the same thickness as that of the reinforcement layer patterns.

9. The transistor according to claim 1, further comprising a spacer layer interposed between the gate pattern and the spacer patterns, the spacer layer covering the gate pattern and the reinforcement layer pattern.

10. A method of forming a transistor comprising:
   forming at least one gate pattern on an active region of a semiconductor substrate, the gate pattern exposing the active region;
   forming reinforcement layer patterns on the active region of the semiconductor substrate, the reinforcement layer patterns contacting the gate pattern to partially expose sidewalls thereof;
   forming impurity regions in the reinforcement layer patterns and the active region of the semiconductor substrate to overlap the gate pattern, the impurity regions including first and second impurity regions; and
   forming spacer patterns on the reinforcement layer patterns to partially cover sidewalls of the gate pattern, wherein
   the reinforcement layer patterns are formed including an epitaxial layer, and the semiconductor substrate is formed including a relaxed silicon germanium ($Si_xGe_y$) layer and a strained silicon layer sequentially stacked on a single crystal silicon base substrate.

11. The method according to claim 10, further comprising forming a spacer layer interposed between the gate pattern and the spacer patterns, wherein the spacer layer is formed to concurrently cover the gate pattern and the reinforcement layer patterns.

12. The method according to claim 10, further comprising forming a gate insulation layer pattern interposed between the gate pattern and the semiconductor substrate, wherein the gate insulation layer pattern is formed to have the same thickness as that of the reinforcement layer patterns.

13. The method according to claim 10, further comprising forming a gate insulation layer pattern interposed between the gate pattern and the semiconductor substrate, wherein the gate insulation layer pattern is formed to have a thickness different from that of the reinforcement layer patterns.

14. The method according to claim 10, further comprising forming device isolation layer in the semiconductor substrate to isolate the active region, wherein the device isolation layer is formed under ends of the reinforcement layer patterns to contact the impurity regions, respectively.

15. The method according to claim 10, wherein the impurity regions are formed to have a conductivity type different from that of the semiconductor substrate.

16. The method according to claim 10, wherein the formation of the impurity regions comprises:
   performing an ion implantation process in the reinforcement layer patterns and the semiconductor substrate using the gate pattern as a mask, thereby forming first impurity ion regions; and
   continuously performing an ion implantation process on the reinforcement layer patterns and the semiconductor substrate using the gate pattern and the spacer patterns as a mask, thereby forming second impurity ion regions overlapping the first impurity ion regions, wherein
   the first and second impurity ion regions are formed to pass the reinforcement layer patterns and the strained silicon layer and be in the relaxed silicon germanium layer.

17. The method according to claim 10, wherein the formation of the reinforcement layer patterns comprises performing RPCVD (Reduced Pressure Chemical Vapor Deposition) on the active region of the semiconductor substrate.

18. The method according to claim 10, wherein the gate pattern is formed using doped polysilicon.

* * * * *